(12) United States Patent
Pletka et al.

(10) Patent No.: US 10,656,847 B2
(45) Date of Patent: May 19, 2020

(54) MITIGATING ASYMMETRIC TRANSIENT ERRORS IN NON-VOLATILE MEMORY BY PROACTIVE DATA RELOCATION

(71) Applicant: INTERNATIONAL BUSINESS MACHINES CORPORATION, Armonk, NY (US)

(72) Inventors: Roman A. Pletka, Zurich (CH); Nikolaos Papandreou, Thalwil (CH); Sasa Tomic, Zurich (CH); Nikolas Ioannou, Zurich (CH); Aaron D. Fry, Richmond, TX (US); Timothy Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 15/976,586

(22) Filed: May 10, 2018

(65) Prior Publication Data
US 2019/0347013 A1    Nov. 14, 2019

(51) Int. Cl.
| | |
|---|---|
| G06F 11/00 | (2006.01) |
| G06F 3/06 | (2006.01) |
| G11C 29/52 | (2006.01) |
| G06F 12/02 | (2006.01) |
| G06F 11/10 | (2006.01) |

(52) U.S. Cl.
CPC ............ *G06F 3/0619* (2013.01); *G06F 3/064* (2013.01); *G06F 3/0647* (2013.01); *G06F 3/0688* (2013.01); *G06F 11/1068* (2013.01); *G06F 12/0246* (2013.01); *G11C 29/52* (2013.01)

(58) Field of Classification Search
CPC ...... G06F 3/0619; G06F 3/064; G06F 3/0647; G06F 3/0688; G06F 11/1068; G06F 12/0246; G11C 29/52
USPC ........ 714/704, 723, 718, 745, 763; 711/148, 711/147, 150, 202, 205, 206, 207, 221, 711/200
See application file for complete search history.

(56) References Cited

U.S. PATENT DOCUMENTS

| | | |
|---|---|---|
| 8,429,501 B2 | 4/2013 | Tseng et al. |
| 9,286,176 B1 | 3/2016 | Tomlin et al. |
| 9,442,799 B2 | 9/2016 | Manasse et al. |

(Continued)

OTHER PUBLICATIONS

Cai, Y., Ghose, S., Haratsch, E. F. et al. (2017). Error Characterization, Mitigation, and Recovery in Flash-Memory-Based Solid-State Drives. Proceedings of the IEEE, 105(9), pp. 1-35. Sep. 2017.

(Continued)

*Primary Examiner* — Christine T. Tu
(74) *Attorney, Agent, or Firm* — Brian F. Russell; Wenjie Li (57) ABSTRACT

A controller performs background reads of multiple physical pages of a selected physical block of a non-volatile memory. The controller detects asymmetric transient errors in a physical page among the multiple physical pages based on a bit error rate (BER) observed in the background read of the physical page. In response to detecting the asymmetric transient errors, the controller mitigates the detected asymmetric transient errors by relocating valid logical pages of data from the physical page to another physical block of the non-volatile memory and by retaining valid logical pages of data programmed into other physical pages of the selected physical block.

19 Claims, 7 Drawing Sheets

(56) References Cited

U.S. PATENT DOCUMENTS

| | | |
|---|---|---|
| 9,710,329 B2 | 7/2017 | Golan |
| 2014/0136927 A1* | 5/2014 | Li .................... G06F 11/1048 714/768 |
| 2015/0067415 A1* | 3/2015 | Miyamoto ............ G06F 11/076 714/704 |
| 2016/0041891 A1* | 2/2016 | Malshe .............. G06F 11/2094 714/704 |
| 2016/0085612 A1 | 3/2016 | Liu |
| 2016/0170682 A1* | 6/2016 | Bakshi ................ G06F 3/0649 711/103 |
| 2017/0185328 A1 | 6/2017 | Li |
| 2017/0286221 A1 | 10/2017 | Azogui et al. |
| 2017/0364298 A1 | 12/2017 | Choi et al. |

OTHER PUBLICATIONS

Peleato, B., Tabrizi, H., Agarwal, R., et al. (2015). BER-based wear leveling and bad block management for NAND flash. Communications (ICC), 2015 IEEE International Conference on, pp. 295-300, 2015.

Bertozzi, D., Carlo, S. D., Galfano, S. et al. (2015). Performance and reliability analysis of cross-layer optimizations of NAND flash controllers. ACM Transactions on Embedded Computing Systems (TECS), 14(1), 26 pages, 2015.

* cited by examiner

MITIGATING ASYMMETRIC TRANSIENT ERRORS IN NON-VOLATILE MEMORY BY PROACTIVE DATA RELOCATION

BACKGROUND OF THE INVENTION

This disclosure relates to data processing and data storage, and more specifically, to mitigating asymmetric transient errors in a non-volatile memory system by proactive data relocation.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories.

In a typical implementation, a NAND flash memory array is organized in physical blocks (also referred to as "erase blocks") of physical memory, each of which includes multiple physical pages each in turn containing a multiplicity of memory cells. By virtue of the arrangement of the word and bit lines utilized to access memory cells, flash memory arrays have generally been programmed on a physical page basis, but erased on a physical block basis. Blocks must be erased prior to being programmed.

As is well known in the art, NAND flash memory is inherently susceptible to bit errors, including error caused by program disturb effects, over-programming effects, read disturb effects, data retention (i.e., errors attributable to decay of the gate charge of programmed cells over time), and wear (i.e., errors attributable to damage to the gate dielectric due to the number of cell program/erase (PE) cycles to which the cell is subjected). In general, the bit error rate (BER) attributable to wear is permanent and increases monotonically over the life of a NAND flash memory. Similarly, program disturb and over-programming effects can be viewed as permanent; even though they disappear after an erase operation, these two types of effects influence the BER already directly after the pages are programmed. Errors, such as those caused by read disturbs, and data retention, are more transient and, although generally increasing over time, disappear by erasure of the affected blocks. After a page is programmed, these transient effects begin to reappear gradually with increasing time and an increasing number of reads.

Data storage systems employing flash memory as a storage media generally implement flash management functions to mitigate these inherent error characteristics of flash memory. Existing systems commonly integrate at least some of these flash management functions into the data path (e.g., error correcting code (ECC) encoding and RAID-like data protection schemes), while other flash management functions operate in the background independently of any external requests for the data stored in the flash memory. Examples of background flash management functions common in enterprise-class flash arrays include read sweeping, which entails reading individual flash pages to detect bit errors, wear leveling, which seeks to equalize the program/erase cycle counts for all flash pages, and block calibration, which determines appropriate read threshold voltages.

BRIEF SUMMARY

The present application recognizes that, while regular transient error effects, such as read disturb, and data retention effects, tend to affect all blocks of a non-volatile memory similarly, another class of transient effects, referred to herein as "asymmetric transient effects" affect different physical blocks and/or physical pages of a flash memory with different probabilities. Examples of these asymmetric transient effects include those induced by shallow erases (i.e., erasures that use too few erase pulses to remove all of the charge on the floating gates of at least some cells in a block) and effects that increase the BER of particular layers, pages, or page groups in a physical block without affecting other layers, physical pages, or page groups in the same physical block. Like regular transient effects attributable to read disturbs and data retention, these asymmetric transient effects generally are reduced or eliminated by erasure of the affected physical block.

The present application recognizes, however, that, in enterprise-class data storage systems incorporating non-volatile (e.g., flash) memory, physical blocks are commonly managed in blocks stripes including many physical blocks. Consequently, while it is desirable to mitigate asymmetric transient effects, it is undesirable to do so by subjecting an entire block stripe, of which only a few physical pages may be experiencing asymmetric transient errors, to garbage collection and erasure.

In view of the foregoing, in at least one embodiment, a controller of a non-volatile memory performs background reads of multiple physical pages of a selected physical block of a non-volatile memory. The controller detects asymmetric transient errors in a physical page among the multiple physical pages based on a bit error rate (BER) observed in the background read of the physical page. In response to detecting the asymmetric transient errors, the controller mitigates the detected asymmetric transient errors by relocating valid logical pages of data from the physical page to another physical block of the non-volatile memory and by retaining valid logical pages of data programmed into other physical pages of the selected physical block.

DETAILED DESCRIPTION

Figure 1A:
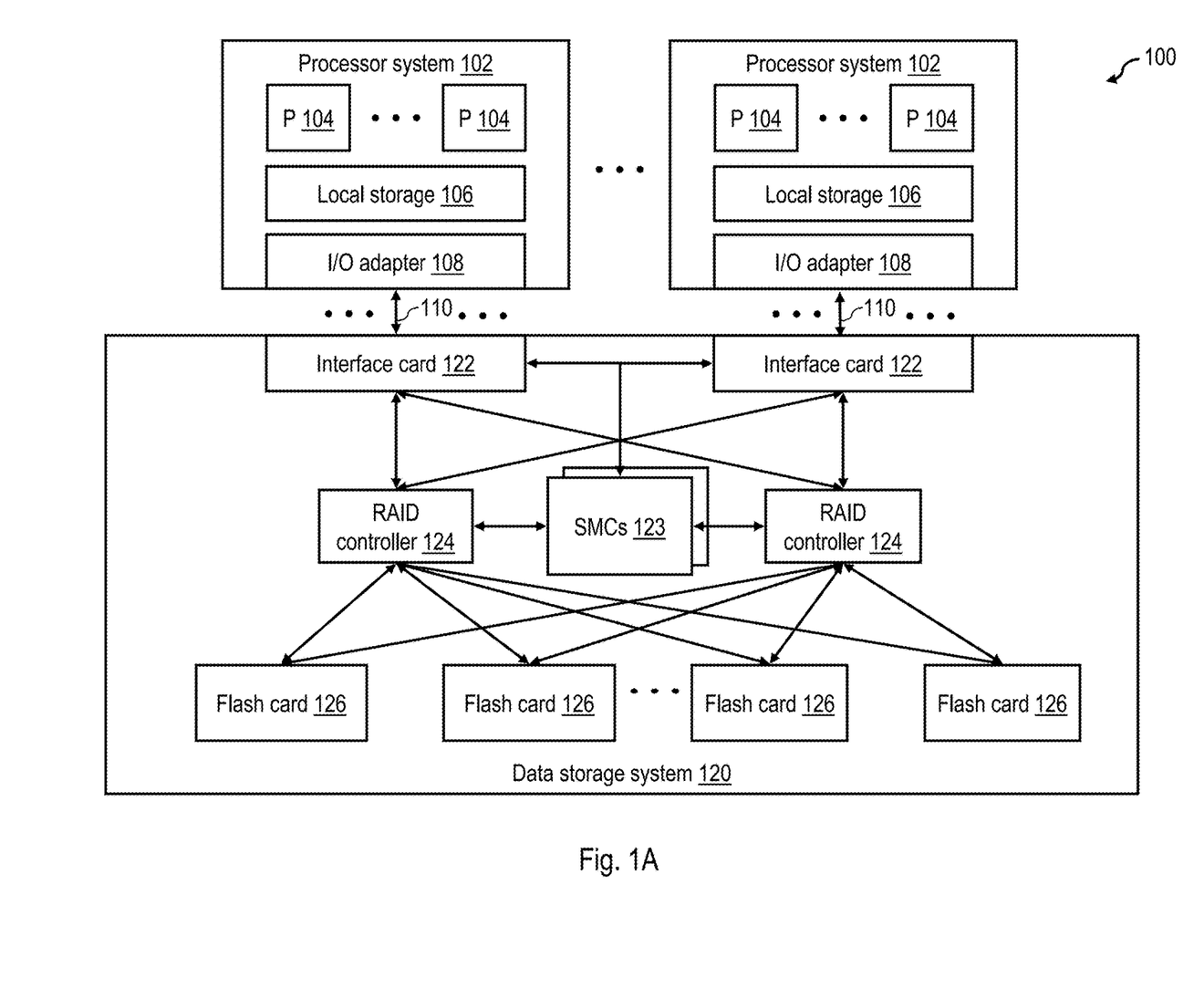
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, POWER, Intel x86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O requests communicated via I/O channel 110 include host read requests by which a processor system 102 requests data from data storage system 120 and host write requests by which a processor system 102 requests storage of data in data storage system 120.

Although not required, in the illustrated embodiment, data storage system 120 includes multiple interface cards 122 through which data storage system 120 receives and responds to I/O requests of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
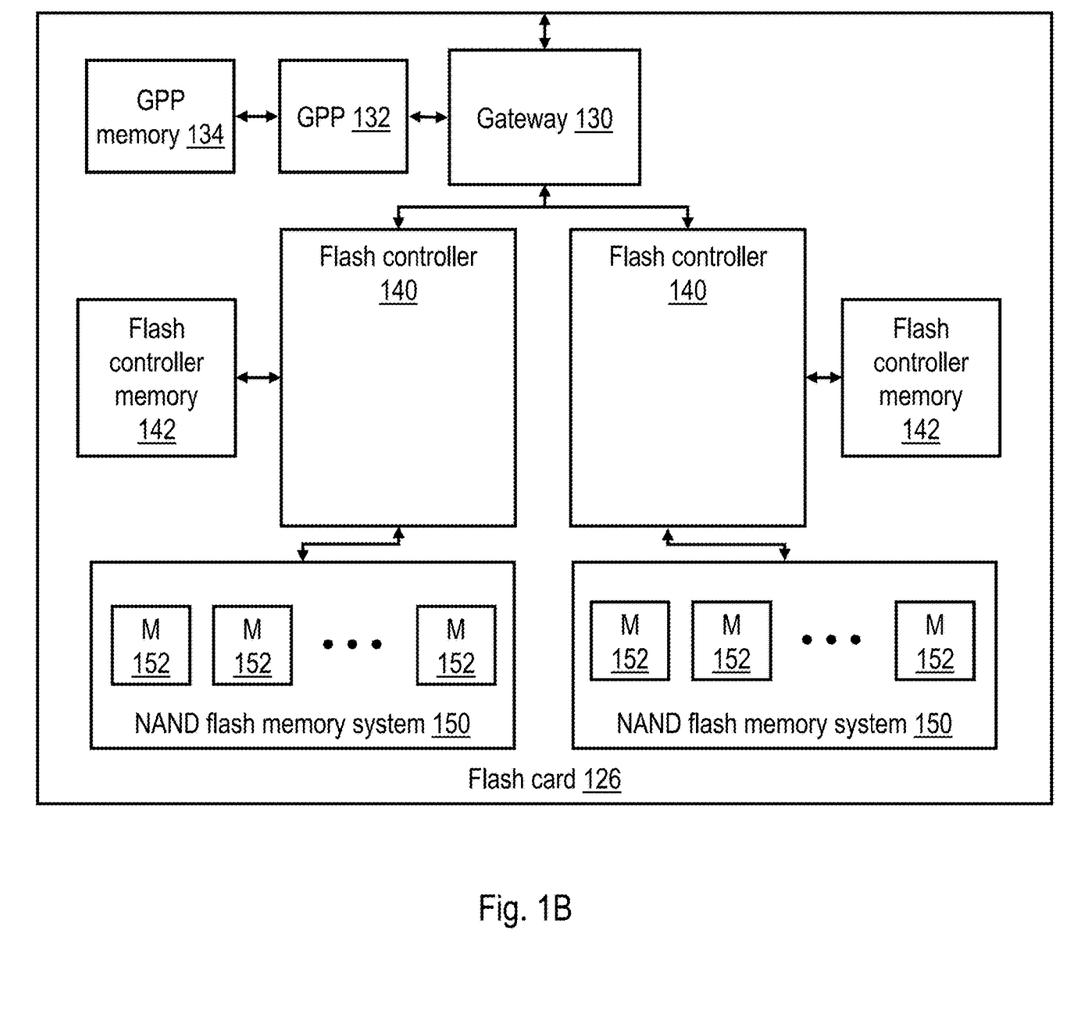
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on requests received by gateway 130 and/or to schedule servicing of the requests by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive host read and write requests from gateway 130 that request to read data stored in NAND flash memory system 150 and/or to store data in NAND flash memory system 150. Flash controllers 140 service these requests, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, a request received by flash controller 140 from a host device, such as a processor system 102, contains the logical block address (LBA) at which the data is to be accessed (read or written) and, if a write request, the write data to be stored to data storage system 120. The request may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
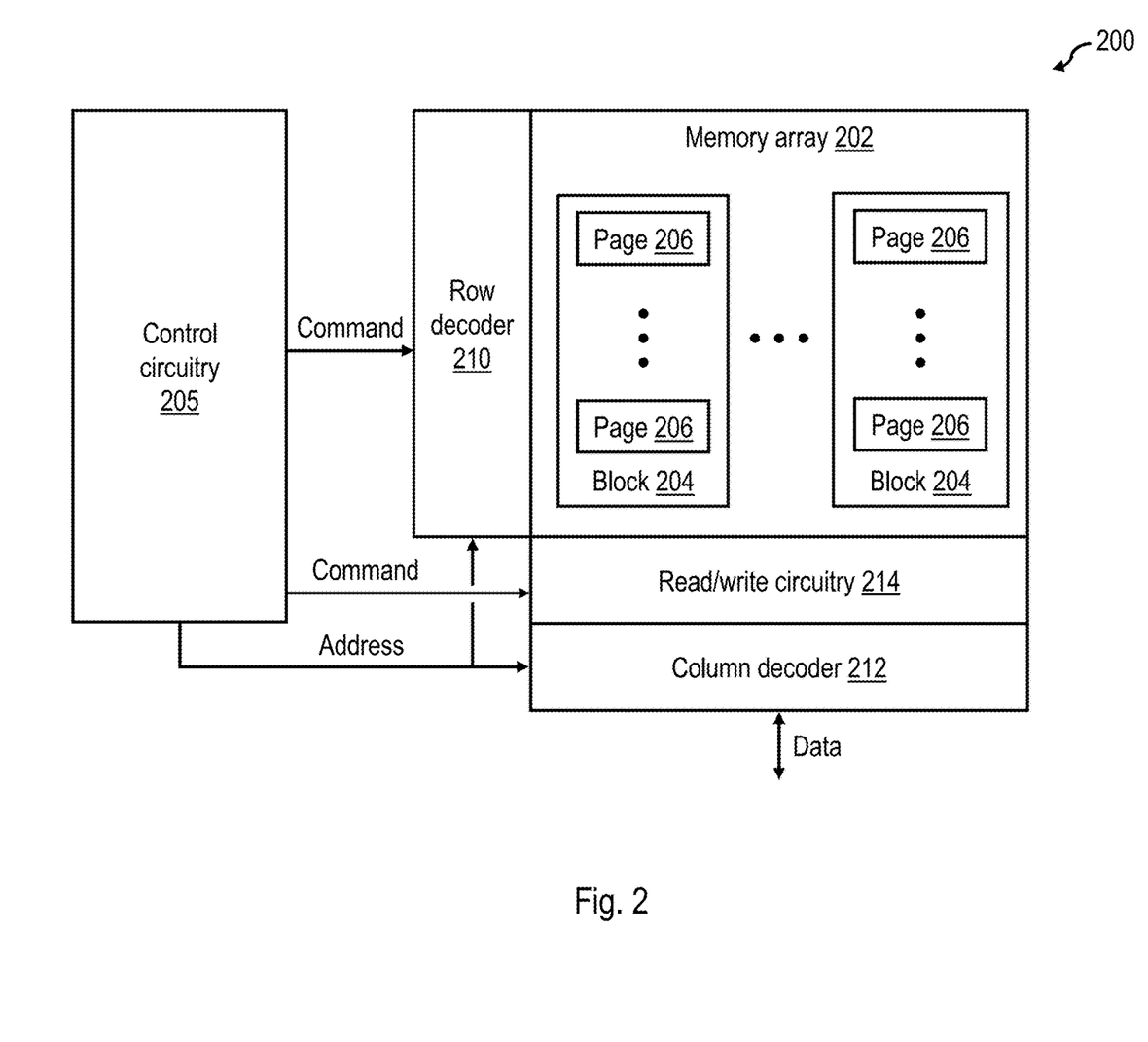
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two-dimensional or three-dimensional array of NAND flash memory cells. As indicated in FIG. 2, the memory cells within memory array 202 are physically arranged in multiple blocks 204, each in turn including multiple physical pages 206. These physical pages can be managed in page groups, which can each be formed, for example, of all the pages coupled to a common wordline, of all pages in one or more layers in a 3D NAND flash, of a set of pages in one or more layers, or generally of pages with similar characteristics.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write request is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus store multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of one or more physical blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life). Because all of the physical block(s) composing a block stripe are generally managed together as a unit for programming and erasure, a block stripe is also referred to in the art as a logical erase block (LEB).

In response to write request received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write request and any non-updated data (i.e., for write requests smaller than a logical page, the remaining valid data from a previous write to the same logical address which is not being overwritten and which must be handled in a read-modify-write manner) from an existing page stripe, if any, targeted by the write request, and/or stores the write data of the write request and any non-updated (i.e., still valid) data from an existing page stripe, if any, targeted by the write request to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. There-after, flash controller 140 can access the data to service host read requests by reference to LPT table 300 as further illustrated in FIG. 3.

Once programming of physical pages in a block stripe has closed, flash controller 140 places an identifier of the block stripe into one of occupied block queues 302, which flash management code running on the GPP 132 utilizes to facilitate garbage collection. As noted above, through the write process, logical pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the physical blocks 204 within the block stripes, the amount of dummy data (if any) in the block stripes, and how much of the data within the erase blocks 204 is invalid. In the illustrated example, garbage collection is performed on entire block stripes (or LEBs), and flash management code running on GPP 132 logs identifiers of the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 issues relocation write requests to data placement function 310 to request that the valid data of the old block stripe be written to a new block stripe in NAND flash memory system 150. In addition, relocation function 314 updates LPT table 300 to remove the current association between the logical and physical addresses of the data. Once all remaining valid data has been moved from the old block stripe, the old block stripe is passed to dissolve block stripes function 316, which decomposes the old block stripe into its constituent physical blocks 204, thus disassociating the physical blocks 204. Each of the physical blocks 204 formerly forming the dissolved block stripe is then erased under the direction of flash controller 140 and/or the control circuitry 205 of the relevant flash memory module 200, and a corresponding program/erase (P/E) cycle count 334 for each erased block is incremented. Based on the health metrics of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing the block 204 on the appropriate ready-to-use (RTU) queue 306 in the associated GPP memory 134.

Figure 3:
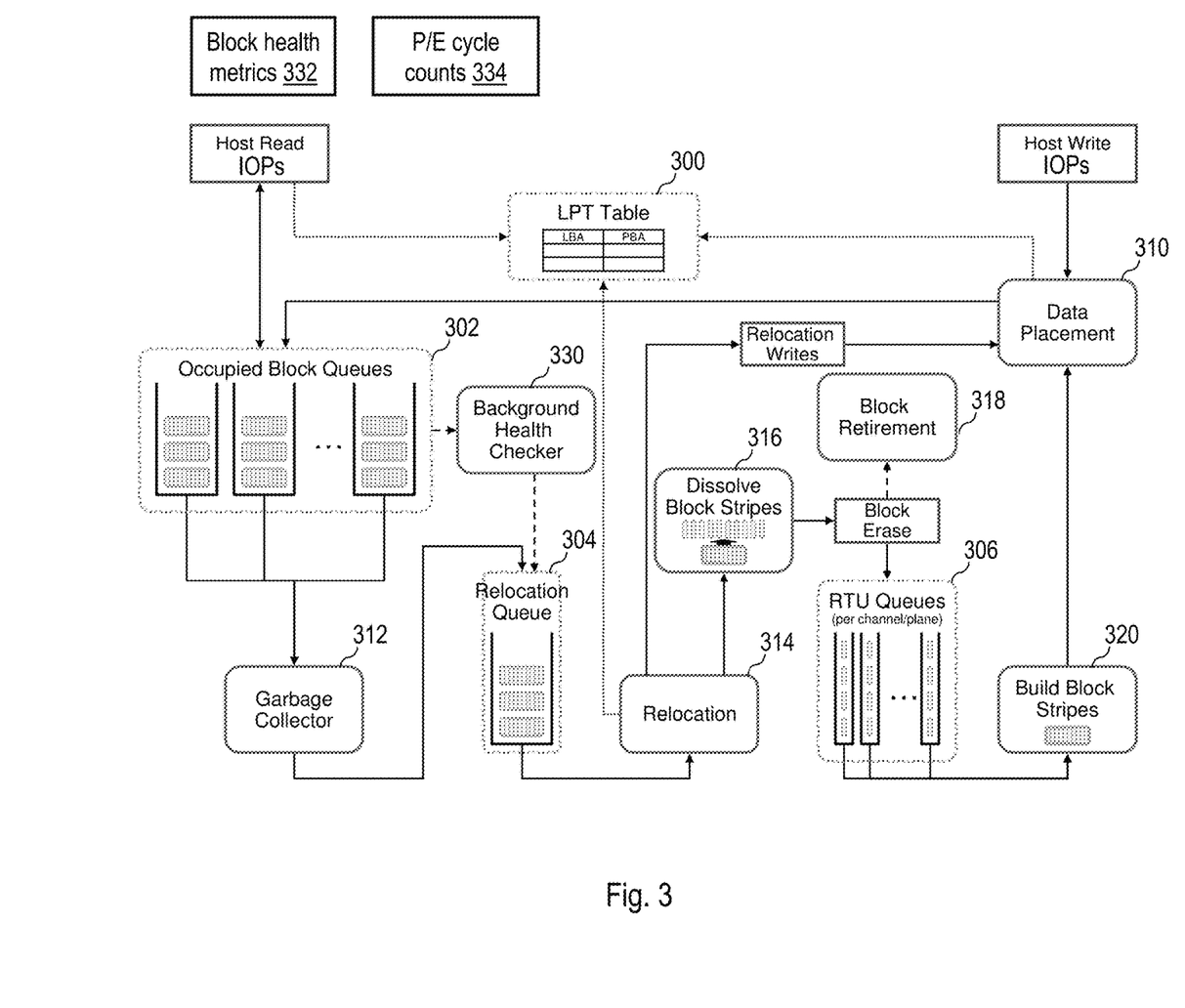
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write requests of hosts such as processor systems 102, continuously determines one or more block health metrics 332 for physical blocks 204 belonging to block stripes recorded in occupied block queues 302. Based on the one or more of the block health metrics 332, a wear leveling function within background health checker 330 places block stripes on relocation queue 304 for handling by relocation function 314. Key block health metrics 332 preferably monitored and recorded by background health checker 330 relate to the bit error rate (BER) metrics observed for valid blocks and physical pages, and may include, for example, the worst page BER of each block and page group, the mean page BER of each block, the rates of change of the worst page BER and mean page BER of each block, etc. In order to obtain the most accurate health estimate possible, a health grade can be determined from an analysis of valid and invalid data, thereby ensuring that blocks containing almost entirely invalid data are fully analyzed to determine overall block health.

Figure 4:
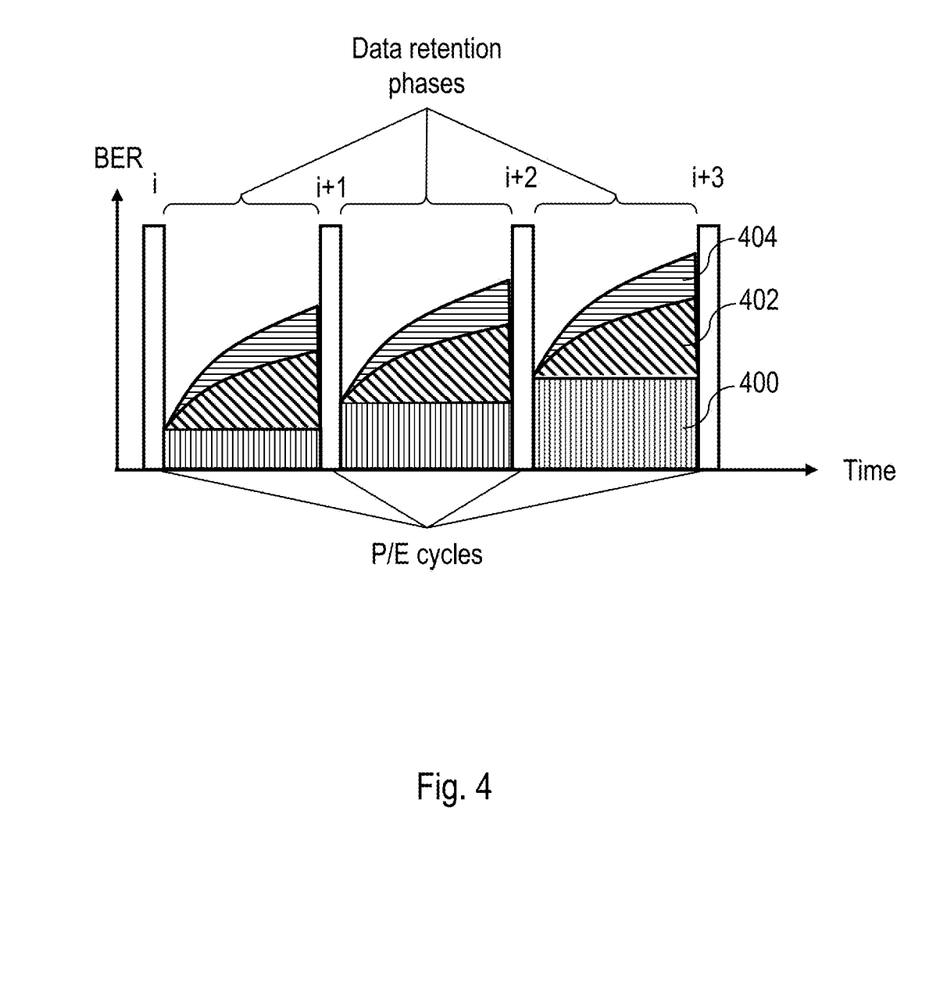
FIG. 4 is a graph of bit error rate (BER) of a physical block of NAND flash memory over time.

Referring now to FIG. 4, a graph of bit error rate (BER) of a typical page 206 in a physical block 204 of NAND flash memory over time is given. As such, a very similar behavior can be observed for the worst page 206 in a physical block 204 or the average BER of all pages 206 in a block 204. In the graph, a number of program/erase (P/E) cycles i, i+1, i+2, i+3, . . . , in which the block is first erased and then programmed, are shown. Between chronologically adjacent P/E cycles, the physical block 204 is in a data retention phase in which the data programmed into the cells of the physical block 204 is retained.

During each P/E cycle, the data programmed within physical block 204 is subject to a BER including at least three components, namely, a first component 400 attributable to wear, program disturb effects, and over-programming effects, a second component 402 attributable to data retention effects, and a third component 404 attributable to read disturb effects. As shown, the first component 400 of the BER is permanent and increases monotonically over the useful lifetime of the physical block 204. However, the second component 402 and third component 404 of the BER are transient and, although generally higher at the end of each succeeding data retention phase, are reduced between the end of one data retention phase and the beginning of the next data retention phase by the erasure performed in the intervening P/E cycle. Even though program disturbs and over-programming effects disappear after an erase operation, they are considered as being permanent effects for the following reasons. First, program disturb effects, sometimes also denoted as cell-to-cell program interference, occur when one or more bits in adjacent cells not intended to be programmed are changed during a cell program operation due to parasitic capacitance coupling between these cells. Second, over-programming, also denoted as program interference or program errors due to two step programming, occurs during a first programming step, when a threshold voltage in a cell on a bitline within a block is incorrectly programmed to a too high value. This results in the cell not being read correctly upon the second programming step and thus in incorrect programming of subsequent pages on the same wordline within the block. Hence, these two effects influence the BER immediately after the pages are programmed and can only be distinguished from other effects by a detailed analysis of all errors in all pages on the same wordline. Therefore, they are considered herein as being permanent effects.

Figure 5A:
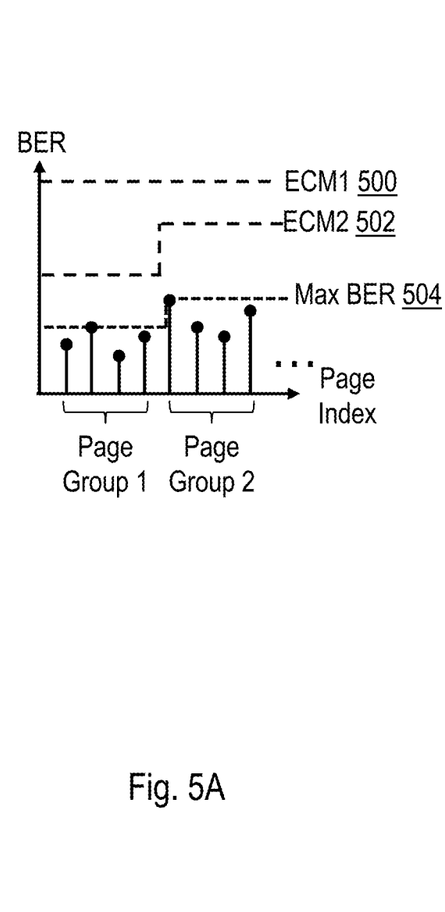
FIG. 5A is a graph of the BER of a physical block of NAND flash memory attributable to wear.

Components 400, 402, and 404 of the overall BER, which are attributable to wear, retention, and disturb and programming effects, generally affect all similar physical pages of a physical block similarly. For example, FIG. 5A illustrates the BER of the physical pages of a physical block of NAND flash memory at a time immediately after programming of all of the physical pages of the physical block has closed. Because, at the illustrated time, programming of the physical block has just closed and no reads have yet been performed to the physical block, the observed BER across the physical pages of the block reflects only the BER attributable to wear, program disturbs, and over-programming (i.e., component 400 of FIG. 4) and does not yet include any BER attributable to read disturb and data retention effects (i.e., components 402 and 404 of FIG. 4). FIG. 5A illustrates that, although the BER varies among the physical pages and page groups of the physical blocks, the BERs across the physical pages forming each page group are fairly close, and the maximum (i.e., worst page) BERs 504 across all of the page groups are fairly close. As a measurement of the distribution of the BERs between physical pages in a page group or between page groups, a controller (e.g., a flash controller 140 and/or GPP 132) may utilize any of a variety of statistical metrics. For example, to determine the distribution of BERs within a page group, the controller may compare an average page BER of the page group with the worst page BER (or the average BER of a predetermined percentage of the worst pages). As further shown in FIG. 5B, The maximum BER 504 of each page group is well below error count margin 1 (ECM1) 500, which is the maximum tolerated per-page group or per-block BER for the predetermined maximum rated data retention time for all physical blocks, as well as ECM2 502, which is the maximum per-page group or per-block BER tolerated for the current data retention time of the physical block. ECM1 500 and ECM2 502 can be set by GPP 132 or flash controller 140, for example, based on the maximum BER that can be corrected by the ECC implemented in the NAND flash memory and/or characterization data indicating the expected impact on BER of the permanent and regular transient effects.

Figure 5B:
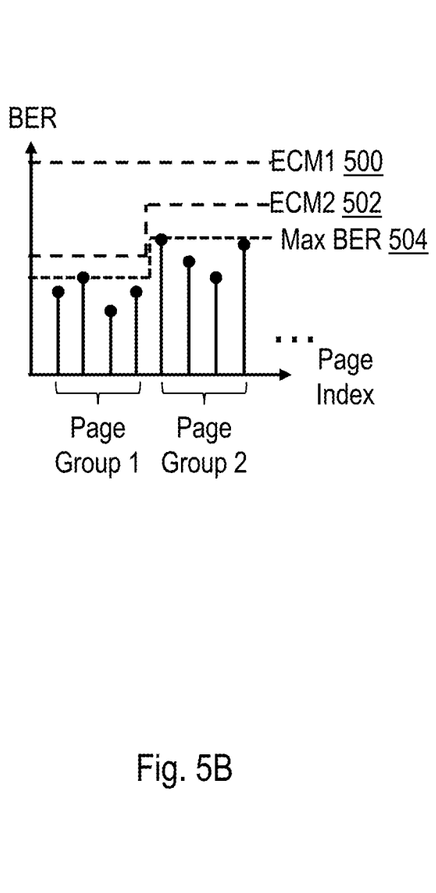
FIG. 5B is a graph of the BER of a physical block of NAND flash memory attributable to wear and regular transient effects.

FIG. 5B is a similar graph to that given in FIG. 5A, except that FIG. 5B depicts the additional per-physical page BER attributable to regular transient effects, such as read disturb and data retention effects, during data retention phases. A controller (e.g., flash controller 140 and/or GPP 132) can generally distinguish between the BER contributed by first component 400 and that contributed by components 402 and 404, for example, based on the number of reads made to the physical block and its current data retention time. FIG. 5B generally indicates that, assuming a relatively even distribution of accesses over the page groups comprising the physical block during a period of data retention, the worst page BER of each page group (as indicated by maximum BER 502) as well as the BERs of the individual physical pages will generally increase in a fairly uniform manner, but will remain below ECM1 500 and ECM2 502.

The present application recognizes, however, that some asymmetric transient errors occur statistically infrequently, yet often enough to cause BER concerns in enterprise-scale storage systems, which can include millions or billions of physical blocks. As noted above, these asymmetric transient effects include those induced by shallow erases, as well as other transient effects that increase the BER of particular layers, pages (e.g., upper pages, lower pages, extra pages, etc.) or page groups in a physical block without affecting other layers, physical pages, or page groups in the same physical block.

Figure 5C:
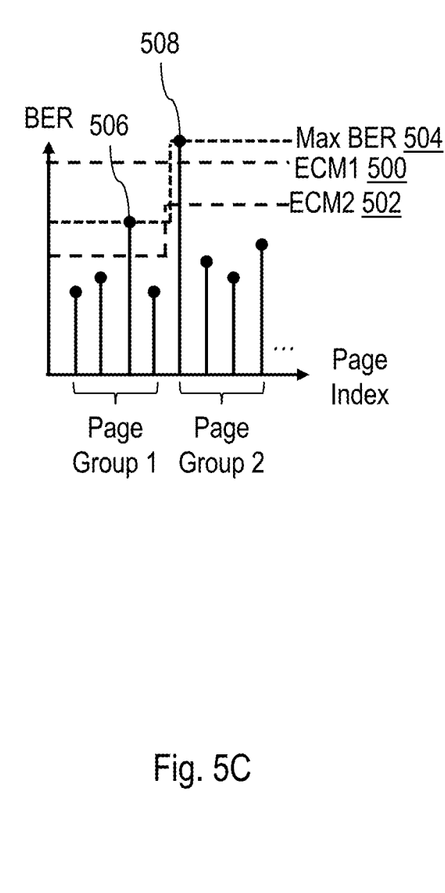
FIG. 5C is a graph of the BER of a physical block of NAND flash memory attributable to wear, regular transient effects, and asymmetric transient effects.

By comparison of FIG. 5C with FIG. 5B, the BER effects attributable to asymmetric transient effects can be readily seen. In this example, asymmetric transient effects have caused the worst page BER of page group 1 (shown at reference numeral 506) to exceed ECM2 502 and for the worst page BER of page group 2 (shown at reference numeral 508) to exceed both ECM2 502 and ECM1 500. However, this dramatic increase in worst page BER may not affect other physical pages in page groups 1 and 2 and/or the worst page BER of one or more page groups in the same physical block.

Figure 6:
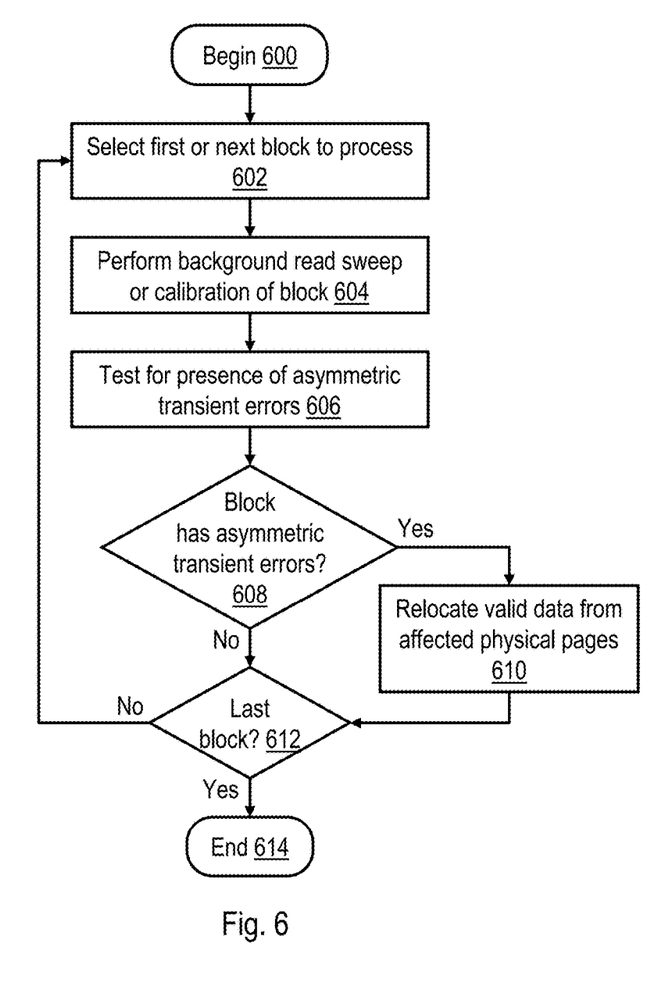
FIG. 6 is a high level logical flowchart of an exemplary process for mitigating asymmetric transient errors in a non-volatile memory in accordance with one embodiment.

Referring now to FIG. 6, there is depicted a high level logical flowchart of an exemplary process for mitigating asymmetric transient errors in accordance with one embodiment. The illustrated process may be performed, for example, in hardware, software, firmware, and/or a combination thereof by flash controller 140 and/or GPP 132, each or both of which may be referred to herein generally as a "controller."

The process of FIG. 6 begins at block 600, for example, in response to elapse of a periodic timer, or based on the current data retention time of a block stripe, or in response to one or more block health metrics 332, or in response to a certain number of write and/or read operations processed, or in response to some other system event. The process proceeds from block 600 to block 602, which depicts the controller of a non-volatile memory selecting a first (or next) physical block of the non-volatile memory to process. At block 604, a background health checker 330 or other function of the controller performs a background read of one or more physical pages of the selected physical block, for example, as part of a background read sweep verifying the readability of programmed data or as part of the calibration of one or more read threshold voltages utilized to distinguish between bit value programmed into the selected physical block. In some cases or embodiments, all physical pages of the selected physical block may be read; in other cases or embodiments, only a sample of physical pages (e.g., two to eight physical pages from each page group) may be read. In performing the background reads and the associated error correction, the controller determines one or more BER statistics for the selected physical block and/or page groups and/or individual physical pages of the selected physical block, including, for example, the worst page BER, the best page BER, the average page BER, the BER distribution, etc.

At block 606, the controller then tests the selected physical block for the presence of asymmetric transient errors, as discussed above with reference to FIG. 5C. In one exemplary embodiment, the controller distinguishes between the contributions to the observed BERs by transient and permanent error effects, for example, based on the number of disturb events (e.g., reads to the selected physical block and/or P/E cycles of adjacent physical blocks) and the current data retention time of the selected physical block. The controller may then detect the presence of asymmetric transient effects based on, for example, characterization data indicating the maximum expected BER attributable to regular transient effects, a comparison between the BERs of physical pages within the selected physical block (or within the same page group of the selected physical block), and/or a comparison between the BERs of the physical pages and ECM1 500 and ECM2 502. The controller can thus detection the presence of asymmetric transient effects by identifying outliers in the current page-level BER distribution that exceed an expected BER suggested by characterization data by a given amount or percentage and/or that exceed an average or individual BER of one or more other physical pages in the block, and/or that exceed an error count margin (e.g., ECM1 500 or ECM2 502), etc.

At block 608, the controller determines whether or not asymmetric transient errors were detected in the selected physical block. If not, the process passes to block 612, which is described below. If, however, the controller detects asymmetric transient errors in the selected physical block, the controller mitigates the asymmetric transient errors at block 610. In some embodiments, the controller can mitigate the detected asymmetric transient errors by simply placing the block stripe including the affected physical block on relocation queue 304. However, in a preferred embodiment, the controller instead mitigates the detected asymmetric transient errors by relocating the valid logical pages of data from only the affected physical pages of the selected physical block to a different physical block and updating LPT table 300 to reflect their new storage location. Valid logical pages of data residing in other pages of the selected physical block are retained in place. As a result of this relocation, the asymmetric transient effects in the block are mitigated in advance of any demand read of the selected physical block by a host. The process then passes to block 612.

Block 612 depicts the controller determining whether or not the selected physical block is a last physical block to be processed in the current iteration of the process or if additional physical blocks (e.g., other blocks in the same block stripe) remain to be processed. If one or more additional physical blocks remain to be processed, the process of FIG. 6 returns to block 602, which has been described. If, however, the processing of all physical blocks in the current iteration is complete, the process of FIG. 6 ends at block 614.

As has been described, in at least one embodiment, a controller performs background reads of multiple physical pages of a selected physical block of a non-volatile memory. The controller detects asymmetric transient errors in a physical page among the multiple physical pages based on a bit error rate (BER) observed in the background read of the physical page. In response to detecting the asymmetric transient errors, the controller mitigates the detected asymmetric transient errors by relocating valid logical pages of data from the affected physical page to another physical block of the non-volatile memory and by retaining valid logical pages of data programmed into other physical pages of the selected physical block.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of mitigating asymmetric errors in a non-volatile memory having an associated controller, the method comprising:
    performing, by the controller, background reads of multiple physical pages of a selected physical block of the non-volatile memory;
    detecting, by the controller, asymmetric transient errors in an affected physical page among the multiple physical pages based on an elevated bit error rate (BER) observed in the background read of the affected physical page that is in excess of a selected BER; and
    in response to detecting the asymmetric transient errors in the affected physical page, mitigating, by the controller, the detected asymmetric transient errors by relocating first valid logical pages of data from the affected physical page to another physical block of the non-volatile memory different than the selected physical block and by retaining second valid logical pages of data programmed into physical pages of the selected physical block different than the affected physical page.

2. The method of claim 1, wherein the detecting comprises detecting the asymmetric transient error by reference to an error count margin.

3. The method of claim 2, wherein the error count margin comprises a threshold BER for a maximum rated data retention period of the non-volatile memory.

4. The method of claim 2, wherein the error count margin comprises a threshold BER based on a current data retention period of the selected physical block.

5. The method of claim 1, wherein:
    the selected physical block comprises a plurality of page groups each including different ones of a plurality of physical pages in the selected physical block; and
    the detecting comprises detecting asymmetric transient errors in the affected physical page by reference to a BER of another page in one of the plurality of page groups including the affected physical page.

6. The method of claim 1, wherein the detecting comprises detecting the asymmetric transient errors in the affected physical page by reference to characterization data for the non-volatile memory.

7. A data storage system, comprising:
    a controller for a non-volatile memory, wherein the controller is configured to perform:
        performing background reads of multiple physical pages of a selected physical block of the non-volatile memory;
        detecting asymmetric transient errors in an affected physical page among the multiple physical pages based on an elevated bit error rate (BER) observed in the background read of the affected physical page that is in excess of a selected BER; and
        in response to detecting the asymmetric transient errors in the affected physical page, mitigating the detected asymmetric transient errors by relocating first valid logical pages of data from the affected physical page to another physical block of the non-volatile memory different than the selected physical block and by retaining second valid logical pages of data programmed into physical pages of the selected physical block different than the affected physical page.

8. The data storage system of claim 7, wherein the detecting comprises detecting the asymmetric transient error by reference to an error count margin.

9. The data storage system of claim 8, wherein the error count margin comprises a threshold BER for a maximum rated data retention period of the non-volatile memory.

10. The data storage system of claim 8, wherein the error count margin comprises a threshold BER based on for a current data retention period of the selected physical block.

11. The data storage system of claim 7, wherein:
the selected physical block comprises a plurality of page groups each including different ones of a plurality of physical pages in the selected physical block; and
the detecting comprises detecting asymmetric transient errors in the affected physical page by reference to a BER of another page in one of the plurality of page groups including the affected physical page.

12. The data storage system of claim 7, wherein the detecting comprises detecting the asymmetric transient errors in the affected physical page by reference to characterization data for the non-volatile memory.

13. The data storage system of claim 7, and further comprising the non-volatile memory.

14. A computer program product, the computer program product comprising:
a computer readable storage device having program instructions embodied therewith, the program instructions being executable by a controller of a non-volatile memory to cause the controller to perform:
performing background reads of multiple physical pages of a selected physical block of the non-volatile memory;
detecting asymmetric transient errors in an affected physical page among the multiple physical pages based on an elevated bit error rate (BER) observed in the background read of the affected physical page that is in excess of a selected BER; and
in response to detecting the asymmetric transient errors in the affected physical page, mitigating the detected asymmetric transient errors by relocating first valid logical pages of data from the affected physical page to another physical block of the non-volatile memory different than the selected physical block and by retaining second valid logical pages of data programmed into other physical pages of the selected physical block different than the affected physical page.

15. The program product of claim 14, wherein the detecting comprises detecting the asymmetric transient error by reference to an error count margin.

16. The program product of claim 15, wherein the error count margin comprises a threshold BER for a maximum rated data retention period of the non-volatile memory.

17. The program product of claim 15, wherein the error count margin comprises a threshold BER based on a current data retention period of the selected physical block.

18. The program product of claim 14, wherein:
the selected physical block comprises a plurality of page groups each including different ones of a plurality of physical pages in the selected physical block; and
the detecting comprises detecting asymmetric transient errors in the affected physical page by reference to a BER of another page in one of the plurality of page groups including the affected physical page.

19. The program product of claim 14, wherein the detecting comprises detecting the asymmetric transient errors in the affected physical page by reference to characterization data for the non-volatile memory.

\* \* \* \* \*